United States Patent
Conso

(10) Patent No.: US 9,854,360 B2
(45) Date of Patent: Dec. 26, 2017

(54) MEMS MICROPHONE AND METHOD OF OPERATING A MEMS MICROPHONE

(71) Applicant: Epcos AG, München (DE)

(72) Inventor: Fabrizio Conso, Frederiksberg (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/300,039

(22) PCT Filed: May 7, 2014

(86) PCT No.: PCT/EP2014/059356
§ 371 (c)(1),
(2) Date: Sep. 28, 2016

(87) PCT Pub. No.: WO2015/169354
PCT Pub. Date: Nov. 12, 2015

(65) Prior Publication Data
US 2017/0150261 A1    May 25, 2017

(51) Int. Cl.
| H04R 3/00 | (2006.01) |
| H04R 3/06 | (2006.01) |
| H04R 1/04 | (2006.01) |
| H03K 5/26 | (2006.01) |
| H04R 29/00 | (2006.01) |
| H04R 19/04 | (2006.01) |

(52) U.S. Cl.
CPC ............... *H04R 3/06* (2013.01); *H03K 5/26* (2013.01); *H04R 1/04* (2013.01); *H04R 29/004* (2013.01); *H04R 19/04* (2013.01); *H04R 2201/003* (2013.01)

(58) Field of Classification Search
CPC ........ H04R 19/04; H04R 3/06; H04R 29/004; H04R 1/04; H04R 2201/003; H03K 5/26
See application file for complete search history.

(56) References Cited

U.S. PATENT DOCUMENTS

| 2009/0316935 | A1* | 12/2009 | Furst | ............... H03F 1/3211 |
| | | | | 381/111 |
| 2010/0300201 | A1 | 12/2010 | Ge | |
| 2013/0101128 | A1* | 4/2013 | Lunner | ............... H04R 25/30 |
| | | | | 381/60 |
| 2013/0195291 | A1 | 8/2013 | Josefsson | |
| 2014/0086433 | A1 | 3/2014 | Josefsson | |
| 2015/0055799 | A1* | 2/2015 | Nandy | ............... G10L 15/00 |
| | | | | 381/92 |

FOREIGN PATENT DOCUMENTS

JP    2011-089980 A    5/2011

* cited by examiner

*Primary Examiner* — Muhammad N Edun
(74) *Attorney, Agent, or Firm* — Nixon Peabody LLP

(57) ABSTRACT

A MEMS microphone which is able to be set to different modes of operation is proposed that requires one single pin to apply an external clock frequency to the microphone. The applied clock frequency is selected according to a desired mode of operation and the microphone detects the applied frequency and sets the mode of operation.

15 Claims, 2 Drawing Sheets

MEMS MICROPHONE AND METHOD OF OPERATING A MEMS MICROPHONE

CROSS-REFERENCE TO RELATED APPLICATIONS

Figure 1:
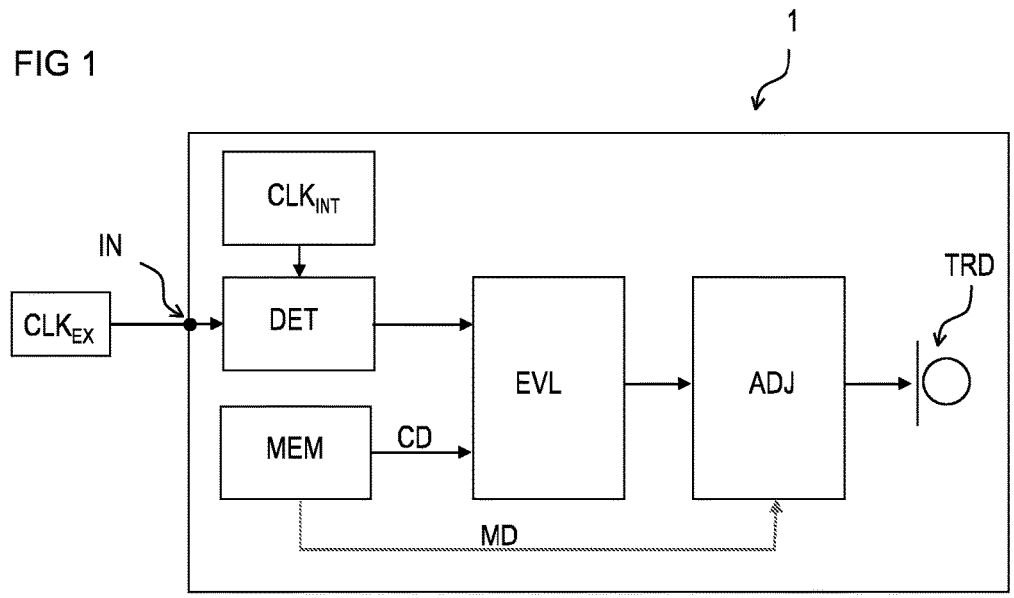

This application is a U.S. National Stage of International Application No. PCT/EP2014/059356, filed May 7, 2014, which is incorporated herein by reference in its entirety.

In electronic devices, a MEMS microphone can be used for many different applications such as phone calls, audio record, voice chat, etc. each requiring different specifications in terms of noise, power consumption and distortion. Different specifications can be matched by implementing additional hardware into the device. If the device is a mobile device low power consumption, restricted space and device area are major demands that have to be matched at the same time.

If a single microphone has to be used in a device, the device must be able to switch or to be switched between different "modes" based on the condition of external signals and the requirements onto the signal quality.

Hence it is an object of the invention to provide a MEMS microphone that is switchable between different modes. Another object is to provide this feature without additional hardware and/or without too much changing the design of the microphone.

This and further objects of the invention are met by a MEMS microphone according to claim 1.

Further features of the invention as well as a method for operating a MEMS microphone are subject of further claims.

The central idea of the invention is to use a frequency that can be coupled to the microphone to set the mode of operation of the microphone. In order to do so, the MEMS microphone comprises an input pin (that is an electrical terminal of the microphone) for applying an external reference clock signal. Within the microphone, a digital frequency detector is provided to detect the frequency of the applied external clock signal. An internal memory is located within the microphone and is used to store a number of frequency thresholds and a number of mode setting data sets.

A mode setting data set comprises specific data that are required for the mode operation which is set by the frequency of the applied external clock signal. Each mode setting data set is assigned to a frequency thresholds.

A gap is provided between two neighbored frequency thresholds that allows safe detection of the frequency respectively safe and correct assignment of the detected frequency to the respective frequency threshold. This is done by an evaluation circuit that is adapted to compare the detected frequency or frequency related data with the stored frequency threshold and is adapted to assign the respective set of stored mode setting data to the detected frequency and the according frequency threshold.

An adjustment circuit within the microphone uses the mode setting data assigned to the frequency of the external clock signal to control the operation of the microphone according to the mode setting data and according to the desired mode of operation to be set.

Adjustment circuit and evaluation circuit may be provided by an integrated circuit and, as such, may be physically not distinguishable.

Such a microphone does not require any modification in the system setup but only needs a fully digital frequency detector. Such a detector and relating circuitry used in combination with a MEMS microphone can produce a simple and effective way that allows using a single microphone in a multi-mode system.

The microphone can be produced with only a negligible increase in area necessary for the microphone and a negligible increase in power consumption. The microphone is very robust and works reliably and independent of any variation of external parameters like temperature variation, process, mismatch, device stress and a lot of further external parameters.

The microphone can be designed with low effort for a high-precision frequency detection and thus can be provided with a high accuracy. As there is a trade-off between accuracy and conversion time necessary for detecting the frequency, the frequency detection can be set to work with a fast or a reliable response on the external reference clock signal.

In addition to the frequency detector, the new microphone does not need any additional hardware because already present components can be used for all functions necessary to operate the microphone.

An internal memory is always present for already known microphones which need to store necessary data that are input from externally. The only difference is that there is a number of sets of mode setting data and the desired set of mode setting data is selected according to the applied external reference clock signal.

Some kind of logic is present in known microphones, too, such that implementing the additional functions like evaluation and adjusting can be easily programmed as new functions of the already present ASIC (application specific integrated circuit) that can do all the logic operations according to the invention.

In an embodiment of the invention, the MEMS microphone comprises an internal clock as a reference for detection of the frequency of the external clock signal. Then, the digital frequency detector is adapted to compare the external clock signal with an internal clock signal as a reference produced by the internal clock. As a result of the comparison, the evaluation circuit assigns the detected frequency to a threshold and hence to the according set of mode setting data. In an intermediate step a mode signal can be generated by the detector that is only roughly complying with the exact frequency for being expressed in units that comprise a given range of frequencies. Then, the evaluation circuit attributes a threshold to the mode signal.

Usually, the internal clock is not an additional component as a MEMS microphone already has such an internal clock.

The digital frequency detector can comprise a first counter for counting the beats of the internal clock signal, thereby providing at a time t a value $N(t)$ of counted internal clock signals as well as a second counter for counting the external clock signal, thereby providing a value $M(t)$ of counted external clock signals. A clock signal like the internal clock signal or the external clock signal is like a series of beats that can be counted, whereby the number of beats per time unit accords to the frequency.

The frequency of the external clock signal can now be easily detected by comparing the two counters, measuring the difference of the current values $M(t)$ and $N(t)$ at a given time t. The given time t can be a time when the value $M(t)$ reaches a preset number M. At this time, the current value $N(t)$ of the first counter can be taken as a measure for the frequency of the external clock signal. This is possible as the ratio $N/M$ is inverse to the ratio of the frequency of the internal clock signal and the external clock signal $F(clock\_int)/F(clock\_ext)$. When the frequency of the external clock signal is detected, the evaluation circuit assigns a threshold thereto according to the data stored in the internal memory. Hence, the accuracy of the frequency detection has only to be as high as a correct threshold assignment is possible. The accuracy can be improved by enhancing the value M that is proportional to the measuring time and the accuracy.

Within the internal memory, different sets of mode setting data can be stored and each set is assigned to a threshold value. With a selected set of mode setting data, the operation of the microphone can be controlled. Hence, the desired mode of operation can be set by selecting the frequency of the external clock according to the threshold that is assigned to the desired set of mode setting data and stored within the internal memory of the microphone.

As can be seen from the foregoing, when comparing the new microphone with known microphones without mode setting feature, the new microphone needs only one additional pin to apply the external clock signal to the microphone. With this single pin, a desired number of operation modes can be set. Compared with a digital input that could be used alternatively to select an operation mode and that would require a number of pins according to the base two logarithm of the desired number of modes, the invention is very simple to implement with a negligible increase in pins. In this context the term "pin" accords to a contact pad of the microphone or another electrical terminal.

In the following, embodiments of the invention will be explained in more detail with reference to the accompanying schematic drawings. The drawings are for better understanding the invention such that only the most important functions of the microphone are depicted where the real microphone comprises further components. As the figures depict block diagrams and each block is assigned to a function, it is possible that two or more blocks and, hence, two or more functions can be provided by a single component.

Figure 2:
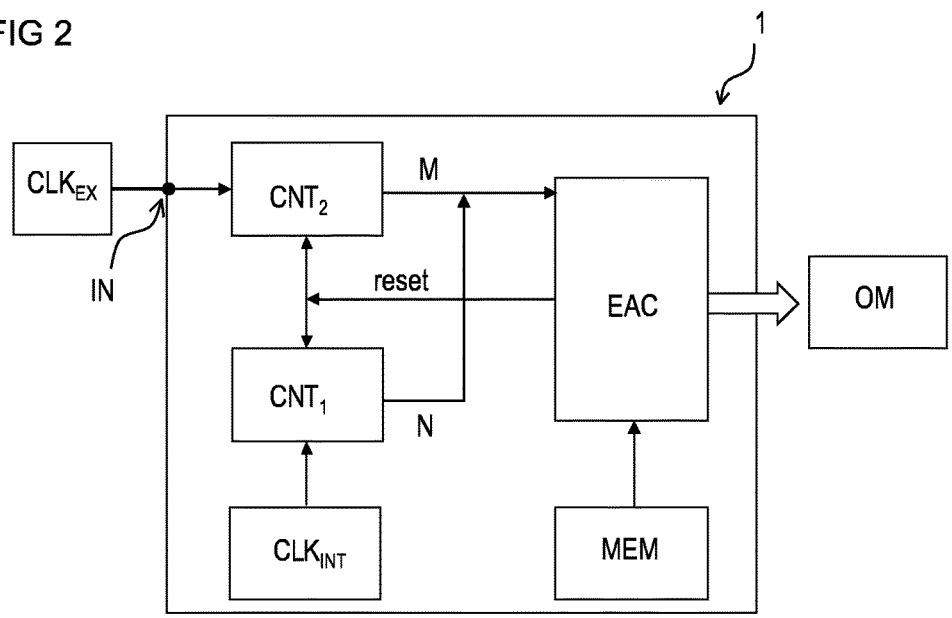
Figure 3:
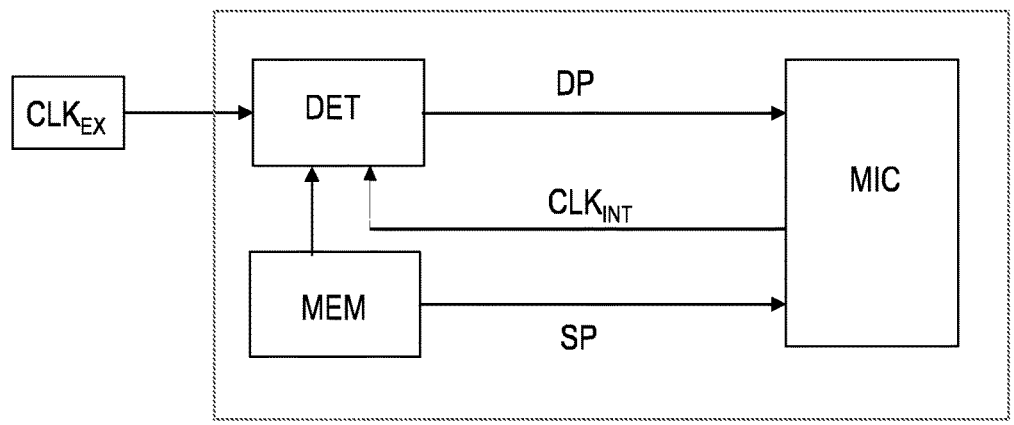
Figure 4:
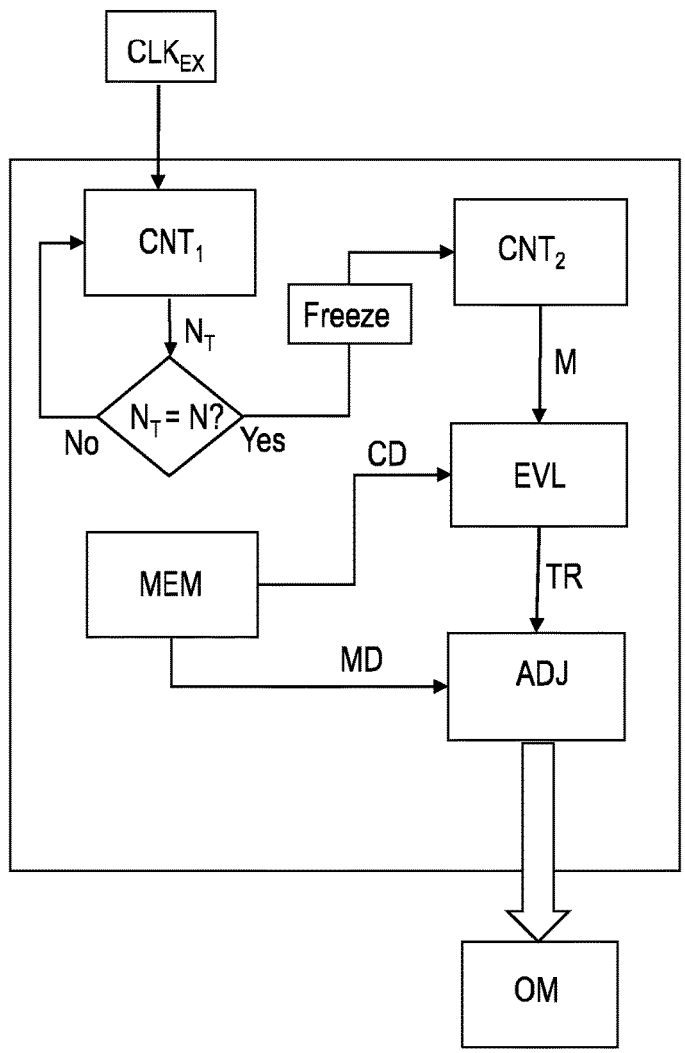

FIG. 1 shows a MEMS microphone with a mode setting according to a first embodiment, FIG. 2 shows a MEMS microphone according to a second embodiment of the invention, FIG. 3 shows the interaction of detector, memory and microphone FIG. 4 shows a block diagram of an inventive method of operation of the MEMS microphone.

FIG. 1 is a diagram showing functional blocks of a MEMS microphone according to the invention. The microphone 1 comprises an input IN for an external clock signal $CLK_{EX}$. Inside the microphone 1, a frequency detector DET compares the signal of the external clock $CLK_{EX}$ and the signal of an internal clock $CLK_{INT}$ and delivers the result to an evaluation circuit EVL. The result may be a mode signal and is a measure for the detected frequency, the accuracy of which can be set. The evaluation circuit EVL compares the result with data stored in an internal memory MEM. The stored data are thresholds and the evaluation circuit EVL assigns a matching threshold to the detected frequency of the external clock $CLK_{EX}$.

A set of calibration data CD can be assigned to adjust or trim the thresholds TR within the evaluation circuit which may be necessary if the accuracy of the internal clock $CLK_{INT}$ is too low and may raise detection failures. The calibration data are input into and stored in an internal memory. All of the detector thresholds may be automatically adjusted with a single calibration word.

The detector DET is instructed to operate continuously without a need of further operations. According to the detected frequency and the assigned threshold the adjustment circuit ADJ controls important parameters of the microphone during operation by using the stored mode setting data MD assigned to the threshold.

The mode setting data MD rule and control important parameters necessary for the operation of the microphone according to the selected operation mode. The mode setting data may be stored in the internal memory. The mode may be selected according to a desired task or according to the environment the microphone is working in. Each such operation mode may be optimized for a given task such as a phone call, audio record, voice chat and so on.

The parameters may comprise the level of a bias voltage applied to the transducer of the microphone. Other adjusted parameters may control the processing of the microphone signal at an analogue or digital stage.

The block diagram of FIG. 2 shows another embodiment of the invention presenting more details when compared to the first embodiment.

This microphone 1 has an internal clock $CLK_{INT}$ providing an internal clock signal to a first counter CNT1. To an input IN of the microphone 1 an external clock $CLK_{EX}$ can be coupled to input an external clock signal which is submitted to a second counter CNT2. The first counter counts the beats of the internal clock $CLK_{INT}$ and delivers a value N(t) while the second counter counts the beats of the external clock $CLK_{EX}$ to provide a value M(t). According to a preset condition, the frequency of the internal clock $CLK_{INT}$ may be higher or lower than the frequency of the external clock $CLK_{EX}$. Hence, N(t) is may be higher or lower than M(t).

The up-counting of N and M proceeds until the value N(t) is equal to a preset value N. At this point of the process, the current value M(t) is frozen and delivered to a logic circuit which may be a combined evaluation and adjustment circuit EAC as shown.

From the frozen value M(t), a threshold according to the frequency of the external clock signal $CLK_{EX}$ can be calculated and assigned to a threshold, and a mode of operation is set according to the corresponding frequency threshold. This is done by the evaluation and adjustment circuit EAC. Actually, an adjustable threshold is used to accurately detect the frequency of the external clock, while the mode is the result of a conversion. The mode setting data control the parameters of the microphone.

So the internal memory MEM has different tasks. Part of the internal memory MEM controls some parameter of the microphone. Another part of the internal memory calibrates the thresholds of the detector, which then evaluate a mode signal, which in turn controls other parameters of the microphone. So, some static parameters SP are controlled directly by the internal memory while some dynamic parameters DP are controlled by the mode signal, which is the output of the detector. To get this mode signal with enough accuracy with the external frequency variation the detector needs to be calibrated. FIG. 3 schematically depicts these interactions of detector DET, memory MEM and the remaining parts of the microphone MIC.

After detection of the external clock frequency, the two counters CNT1, CNT2 are reset to count again starting from zero in order to detect whether a variation of the external clock frequency which complies with a new mode setting signal has happened. If no variation can be detected the microphone keeps on working in the same mode OM. If a variation according to another threshold is detected the according new mode of operation of the microphone is set.

This embodiment uses simple components which all may be part of an integrated circuit which provides all the necessary functions depicted in FIG. 2.

To make the MEMS microphone 1 working accurately, a very precise internal clock would be required as the overall precision of the frequency detected depends on the precision of the internal clock which is a reference for detecting the external clock frequency. A precise internal clock means a clock whose frequency is definite. As a precise internal clock would be too expensive, a special calibration strategy has been developed to calibrate the imprecise internal clock. Hence, the use of an inaccurate internal clock is possible by trimming the digital frequency threshold of the detector in dependence of the frequency deviation of the internal clock. Since both the operation and the trimming of the detector are done in the digital domain, an inexpensive and very save approach is given allowing a multi-mode functionality of the MEMS microphone.

As mentioned above, the imprecise internal clock needs to be trimmed or calibrated, which can be done by trimming the frequency thresholds according to a measurement of the frequency of the internal clock. This measurement has to be done once after manufacture of the microphone because after storing trimming or calibration data, and despite using an imprecise internal clock the frequency detection provides a correct and consistent result independent from any frequency variation of the internal clock due to a manufacture tolerance.

A first method for trimming the internal clock is to output the internal clock signal from the device and measure the frequency during the calibration phase of the device. Knowing the exact frequency of the internal clock leads directly to a correct calibration word that is required to trim all the thresholds. A light drawback of this method is related to the necessity to use an extra pin or pad to output the internal clock signal or to add a complex circuit allowing to re-use an existing pad for outputting the internal clock signal.

According to a second method for trimming the frequency of the internal clock, one of the dummy components placed inside the scribe lines of the evaluation and adjustment circuit EAC by the manufacturer to monitor process parameters is used to create a map of variations of the most important parameters from a nominal value wherein these parameters are dependent on the frequency of the internal clock. With this map a guess of the internal clock frequency can be done.

A third and last method consists in searching the correct calibration data by a successive approximation algorithm, while monitoring some particular parameter of the device. Details of this third method are explained later on.

Then, to proof the correctness of the guess or to search for the correct calibration data a respective first set of trimming data is inputted to trim the frequency thresholds according to the estimated frequency of the internal clock. An external clock frequency is applied according to a selected threshold and then swept around this frequency threshold. A physical value of the microphone which is supposed to change with setting a new operation mode is monitored. A parameter that can easily be monitored is the power or current consumption of the MEMS microphone for example. If no change of this parameter occurs, new trimming data are set and the external frequency is swept again around the selected frequency threshold and it is monitored whether a change of the value occurs. If not, new trimming data are set and the proceeding is repeated.

If the selected threshold is the tightest that is the threshold with the smallest distance from an adjacent threshold all thresholds can be trimmed at the same time with the same calibration data.

For example it is supposed that the power consumption will change according to a change in the operation mode at a digital frequency threshold of 2.0 MHz. Then, the external clock frequency applied to the microphone is swept around the 2.0 MHz value and the frequency threshold is trimmed until a change in the current consumption is detected. If the power consumption remains the same while sweeping around the 2.0 MHz value and the power consumption keeps at a value that is expected to accord to the operation mode, the desired 2.0 MHz threshold is lowered to accord to the external clock frequency. If vice-versa, the opposite behavior is detected, the according frequency threshold is adjusted to a higher value. With this approximation algorithm the exact value of the calibration word can be found with few steps.

FIG. 4 is a block diagram depicting a method of operation of the inventive MEMS microphone 1. The method corresponds to the microphone depicted in FIG. 2. Hence, the method of operation starts with counting an internal clock signal $CLK_{INT}$ in a first counter CNT1 and counting an external clock signal $CLK_{EXT}$ in a second counter CNT2. The first counter CNT1 delivers a value N(t) to a comparator. If N(t) equals N, the counted value of the second counter CNT2 is frozen. The frozen value M) of the second counter CNT2 is delivered to an evaluation circuit EVL. In this circuit EVL, the detected or measured value M is compared with a threshold which is adjusted by the calibration word stored in an internal memory MEM. The other thresholds are then calculated by the evaluation circuit EVL as the frequencies thereof are lying in a given mutual distance or have a given relation to the first threshold.

The adjustment circuit ADJ governs and controls the mode of operation OM of the microphone, which may be done by setting a BIAS voltage or by setting an amplifier gain while amplifying the detected transducer signal of the microphone transducer TRD. The mode of operation that is set may comprise a change of other process parameters, too, that are important for the selected mode of operation.

The MEMS microphone according to the invention represents a valid solution that allows controlling the behavior of a MEMS microphone via a single pin. This solution is also very robust and reliable in time and does not depend on any variation of working conditions of the microphone. Moreover, this circuit can be applied to any already existing microphone interfaces without any effort. It needs only adding a negligible area to the footprint of the microphone and causes only a very low increase of power consumption. It allows the use of a very low precision internal clock as it comprises a trimming process for the internal clock. The developed calibration strategy of the internal clock shortens the calibration time of the device without requiring any additional pin.

A further advantage is that a system within that the microphone is installed usually provides different clock frequencies which can be used for the mode setting such that no additional clock is required.

The invention is not restricted to the depicted embodiments and the accompanying drawings. The invention is only defined by the claims and has to be understood and interpreted in its broadest sense. Hence, the microphone and the process of operating the same as well as the process of calibrating and trimming the microphone is not restricted to any disclosed parameter or value but can be used with other parameters, too.

LIST OF REFERENCE NUMERALS

| | | |
|---|---|---|
| 1 | MEMS microphone | |
| IN | input pin (for applying an external reference clock signal) | |
| DET | digital frequency detector | |
| MEM | internal memory (for storing frequency thresholds and calibration data | |
| EVL | evaluation circuit | |
| ADJ | adjustment circuit | |
| $CLK_{INT}$ | internal clock | |
| $CLK_{EX}$ | external clock | |
| CNT1 | first counter (for counting the internal clock signal) | |
| CNT2 | second counter (for counting the external clock signal) | |
| EAC | logic circuit | |
| OM | operation mode | |
| TRD | Transducer | |
| SP | Static parameter | |
| DP | Dynamic parameter | |
| CD | Calibration data | |
| TR | Threshold | |
| MD | Mode setting data | |

The invention claimed is:

1. A MEMS microphone, comprising
an input pin for applying an external reference clock signal
a digital frequency detector for detecting the frequency of the applied external reference clock signal
an internal memory for storing a number of frequency thresholds and a number of mode setting signals each being assigned to one the frequency thresholds
an evaluation circuit adapted for comparing the detected frequency with the stored frequency thresholds and for selecting the respective mode setting signals according to the detected frequency threshold
an adjustment circuit for adjusting the operation of the microphone according to the mode setting signals.

2. The MEMS microphone of claim 1,
comprising an internal clock
wherein the digital frequency detector is for comparing the external clock signal with an internal clock signal as a reference produced by the internal clock and for delivering a mode signal as a result of the comparison
wherein the evaluation circuit is adapted to assign the mode signal to a threshold and to the according set of mode setting data.

3. The MEMS microphone of claim 2,
wherein the digital frequency detector comprises
a first counter for counting the internal clock signal thereby providing a value N of counted internal clock signals,
a second counter for counting the external clock signal thereby providing a value M of counted external clock signals
a logic circuit for storing the current value M at the time when the value N reaches a preset number
wherein the evaluation circuit is adapted to assign a threshold to the stored value of M.

4. The MEMS microphone of claim 3,
wherein the internal memory stores different sets of mode setting data each set being assigned to a frequency threshold
wherein each set of mode setting data is adapted to provide an mode of operation
wherein a desired mode of operation can be set by selecting the frequency of the external clock according to the frequency threshold the desired set of mode setting data are assigned to.

5. The MEMS microphone of claim 2,
wherein the internal memory stores different sets of mode setting data each set being assigned to a frequency threshold
wherein each set of mode setting data is adapted to provide an mode of operation
wherein a desired mode of operation can be set by selecting the frequency of the external clock according to the frequency threshold the desired set of mode setting data are assigned to.

6. The MEMS microphone of claim 1,
wherein the internal memory stores different sets of mode setting data each set being assigned to a frequency threshold
wherein each set of mode setting data is adapted to provide an mode of operation
wherein a desired mode of operation can be set by selecting the frequency of the external clock according to the frequency threshold the desired set of mode setting data are assigned to.

7. A method of operating a MEMS microphone,
the method comprising the steps
providing a MEMS microphone comprising an internal memory to store different sets of mode setting data each set being assigned to a frequency threshold
applying an external clock signal to an input pin of the MEMS microphone
detecting the applied frequency within the MEMS microphone
assigning the detected frequency to a threshold stored within an internal memory of the microphone
operating the MEMS microphone thereby using the mode setting data assigned to the frequency threshold to adjust at least an operating parameter according to a desired operation mode
wherein the operation mode is set by selecting an according external frequency of the external clock and applying an according external clock signal to the input pin.

8. The method of claim 7,
wherein the step of detecting the applied frequency comprises
starting a procedure at a time $t_0$
counting the beats M(t) of the external clock
counting the beats N(t) of an internal clock of the microphone until a preset value $N_x$ of beats is reached at a time $t_x$
assigning a frequency threshold to the value $N_x$.

9. The method of claim 8,
wherein the step of assigning the set of mode setting data to the detected frequency comprises
assigning the detected frequency to a threshold stored within an internal memory of the microphone
assigning the set of mode setting data taken from the internal memory to the threshold according to a preset relation stored in the internal memory.

10. The method of claim 8,
comprising the step of trimming the thresholds to adjust the frequency thresholds according to a difference of the frequency of the internal clock and a frequency of a standard clock
wherein the step of trimming is done one time after manufacturing of the MEMS microphone
wherein all thresholds are trimmed or calibrated in the same way in one step by respective calibration data.

11. The method of claim 7,
wherein the step of assigning the set of mode setting data to the detected frequency comprises
assigning the detected frequency to a threshold stored within an internal memory of the microphone
assigning the set of mode setting data taken from the internal memory to the threshold according to a preset relation stored in the internal memory.

12. The method of claim 11,
comprising the step of trimming the thresholds to adjust the frequency thresholds according to a difference of the frequency of the internal clock and a frequency of a standard clock
wherein the step of trimming is done one time after manufacturing of the MEMS microphone
wherein all thresholds are trimmed or calibrated in the same way in one step by respective calibration data.

13. The method of claim 7,
comprising the step of trimming the thresholds to adjust the frequency thresholds according to a difference of the frequency of the internal clock and a frequency of a standard clock
wherein the step of trimming is done one time after manufacturing of the MEMS microphone
wherein all thresholds are trimmed or calibrated in the same way in one step by respective calibration data.

14. The method of claim 13,
wherein the step of trimming comprises
measuring the frequency of the internal clock at a pin of the MEMS microphone
comparing the frequency of the internal clock with the frequency of the standard clock and specifying a discrepancy
assigning calibration data to the discrepancy and storing the calibration data in the internal memory.

15. The method of claim 7,
wherein the step of trimming comprises
a) selecting a physical operation parameter of the MEMS microphone
b) applying an external clock frequency to an input pin of the microphone
c) creating a map of how the parameter varies in response to an applied external clock frequency
d) guessing the frequency of the internal clock
e) putting a set of calibrating data into the internal memory of the microphone adapted to trim the frequency thresholds according to the estimated frequency of the internal clock
f) applying an external clock frequency according to a selected frequency threshold
g) sweeping the frequency of the external clock around the selected frequency threshold
h) measuring a selected parameter of the microphone who is prone to a change of operation mode
i) when no change of the selected parameter according to a change of operation mode is detected while sweeping around the selected threshold frequency: creating and setting a new set of threshold trimming data and repeating steps f) to h)
j) when a change of the selected parameter according to a change of operation mode is detected at the selected threshold frequency: finally storing the trimming data into the internal memory of the MEMS microphone.

\* \* \* \* \*